United States Patent [19]

Kim

[11] Patent Number: 5,593,813
[45] Date of Patent: Jan. 14, 1997

[54] METHOD FOR FORMING SUBMICROSCOPIC PATTERNS

[75] Inventor: Hyeong S. Kim, Kyoungki-do, Rep. of Korea

[73] Assignee: Hyundai Electronics Industries Co. Ltd., Kyoungki-do, Rep. of Korea

[21] Appl. No.: 501,605

[22] Filed: Jul. 12, 1995

[30] Foreign Application Priority Data

Jul. 14, 1994 [KR] Rep. of Korea .................. 94-16980

[51] Int. Cl.⁶ .................................................. G03F 7/22
[52] U.S. Cl. ............................ 430/312; 216/2; 437/228; 437/229
[58] Field of Search .................................. 430/312, 314; 216/2; 437/228, 229, 228 M

[56] References Cited

U.S. PATENT DOCUMENTS 5,023,203 6/1991 Choi ........................................ 437/228
5,407,785 4/1995 Leroux .................................... 430/312

*Primary Examiner*—Cynthia Hamilton
*Attorney, Agent, or Firm*—Gary M. Nath; Nath & Associates

[57] ABSTRACT

A method for forming submicroscopic patterns of a semiconductor device, which comprises: coating a photoresist film on a lower layer to be patterned; primarily exposing the photoresist film through a mask having chrome patterns to a light with an energy lower than the threshold energy for the thickness of the photoresist film; secondarily exposing the photoresist film through the mask to a light with an energy lower than the threshold energy, said mask having been shifted at a predetermined distance; subjecting the exposed photoresist film to development, to completely remove the regions in which the primarily exposed regions overlap with the secondarily exposed regions and half remove the once-exposed regions to form photoresist film patterns, each having four side walls; depositing an insulating layer entirely over the resulting structure; subjecting the insulating layer to anisotropic etch, to form insulating layer spacers at the side walls of the photoresist film patterns; and dry etching the photoresist film patterns and the lower layer with the insulating layer spacers serving as a mask, to form lower layer patterns having a submicroscopic width and a submicroscopic distance therebetween, whereby more submicroscopic patterns than photolithography can allow can be formed.

7 Claims, 3 Drawing Sheets

METHOD FOR FORMING SUBMICROSCOPIC PATTERNS

BACKGROUND OF THE INVENTION

1. Field of the Invention

The present invention relates, in general, to a method for forming submicroscopic patterns and, more particularly, to a method for forming more submicroscopic patterns than photolithography can allow by taking advantage of the difference in the thickness of a photoresist film left after exposure to different light energies.

2. Description of the Prior Art

As semiconductor devices are more highly integrated, patterns necessary to fabricate the semiconductor devices are required to be more submicroscopic. It is well known that more submicroscopic patterns than can be obtained by typical photolithographic processes are formed. For example, as a mask, insulating spacers are utilized which are formed at the side walls of a submicroscopic photoresist film pattern on a lower layer.

However, although the width of the insulating spacers could be less than that of the photoresist film pattern, it is impossible to make the distance between the insulating spacers narrower than the width of the photoresist film patterns.

SUMMARY OF THE INVENTION

Accordingly, it is an object of the present invention to overcome the above-mentioned problems encountered in the prior art and to provide a method for forming submicroscopic patterns, which results in reducing the distance between submicroscopic patterns into less than that which photolithography could allow.

The above object could be accomplished by providing a method for forming submicroscopic patterns of a semiconductor device, comprising the steps of: coating a photoresist film on a lower layer to be patterned; primarily exposing the photoresist film through a mask having chrome patterns to a light with an energy lower than the threshold energy for the thickness of the photoresist film; secondarily exposing the photoresist film through the mask to a light with an energy lower than the threshold energy, said mask having been shifted at a predetermined distance; subjecting the exposed photoresist film to development, to completely remove the regions in which the primarily exposed regions overlap with the secondarily exposed regions and half remove the once-exposed regions to form photoresist film patterns, each having four side walls; depositing an insulating layer entirely over the resulting structure; subjecting the insulating layer to anisotropic etch, to form insulating layer spacers at the side walls of the photoresist film patterns; and dry etching the photoresist film patterns and the lower layer with the insulating layer spacers serving as a mask, to form lower layer patterns having a submicroscopic width and a submicroscopic distance therebetween.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENT

Figure 1:
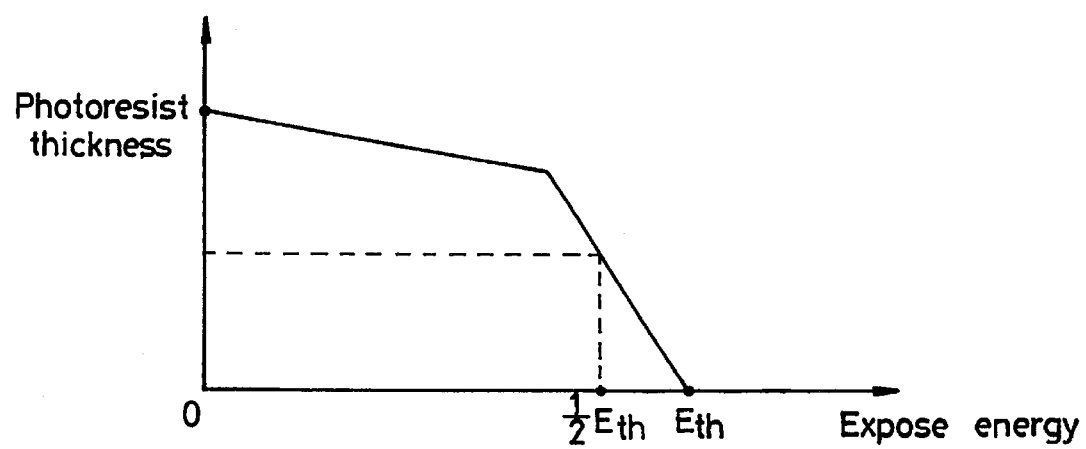
FIG. 1 shows that, after a photoresist film coated on a substrate is exposed to a light, the thickness of the photoresist film left upon wet development varies depending on the light energies.

The application of the preferred embodiments of the present invention is best understood with reference to the accompanying drawings, wherein like reference numerals are used for like and corresponding parts, respectively.

With reference to FIG. 1, there is a graph showing that, after a photoresist film coated on a substrate is exposed to a light, the thickness of the photoresist film left upon wet development varies depending on the light energies. In this graph, the minimum exposure energy which can completely remove the photoresist film is denoted as the threshold energy ($E_{th}$). That is, if the photoresist film is exposed to a light with the threshold energy or more, it is completely removed upon wet development. On the other hand, if the photoresist film is exposed to a light with less than the threshold energy, it remains after wet development. In the latter case, the energy which makes the thickness of the photoresist film remain as half of the initial thickness is expressed as ½ $E_{th}$.

The present invention is to take advantage of the difference in the thickness of a photoresist film left after exposure to different light energies, so as to form insulating spacers at the side walls of photoresist film patterns. That is, in the present invention, if a photoresist film is primarily exposed to a light with ½ $E_{th}$ under a mask arrangement and then, exposed to a light with the same energy under a shifted mask arrangement, the remaining thickness of the photoresist film in the twice-exposed area is different from that of the photoresist film in the once-exposed area.

A description of an embodiment according to the present invention will be, in detail, given below in conjunction with FIGS. 2 through 8.

Figure 2:
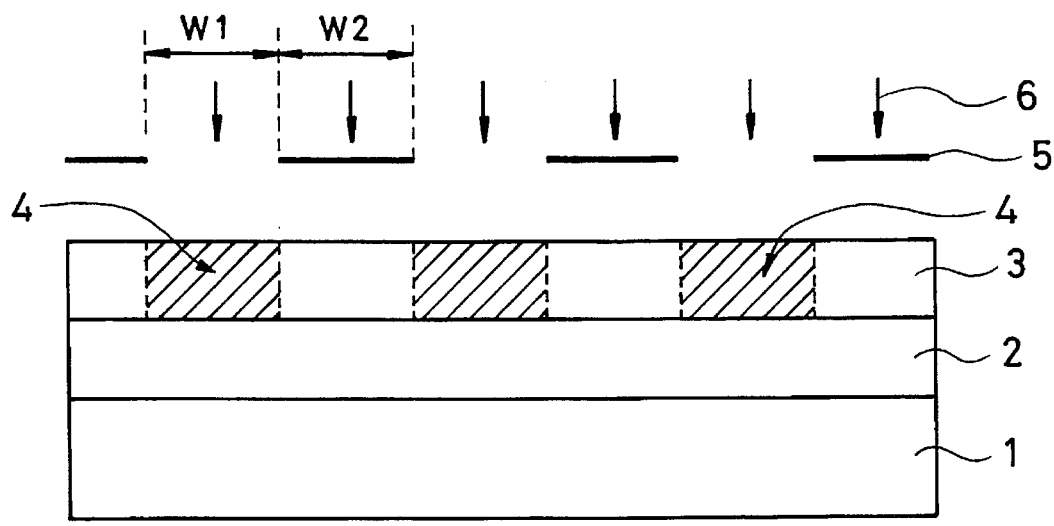
FIGS. 2 through 8 are schematic cross sectional views showing process steps for forming submicroscopic patterns, in accordance with the present invention.

First, with reference to FIG. 2, a lower layer 2 to be patterned is formed on a substrate 1, coated with a positive photoresist film 3 with a predetermined thickness and primarily exposed to a light 6 through a mask 5 having a chrome pattern, to form primary exposed regions 4. At this time, the energy of the light is half of $E_{th}$, an amount of energy able to completely remove the photoresist film.

In the meanwhile, the width $W_1$ of the exposed regions and the width $W_2$ of the unexposed regions, both discriminated by the chrome pattern of the mask 5, can be formed into the most submicroscopic pattern that can be made by photolithography.

Figure 3:
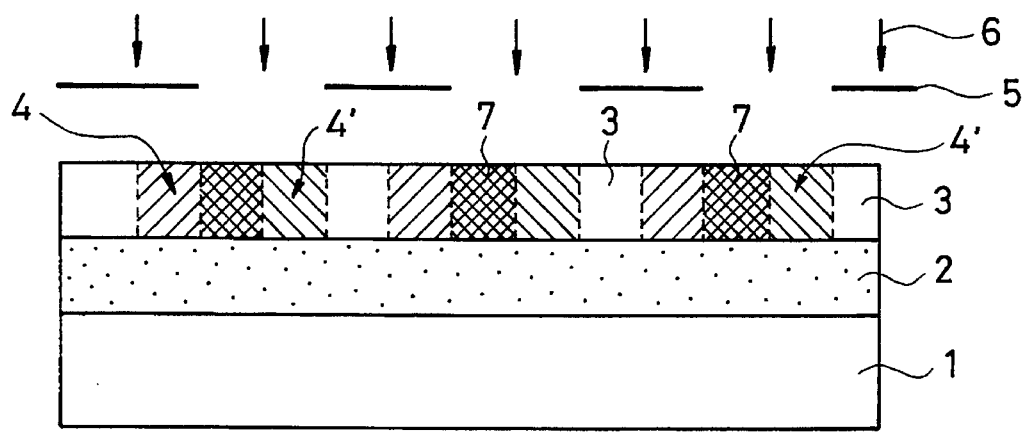

FIG. 3 is a cross sectional view after the used mask 5 is shifted at a distance of the half of W1, leftward or rightward, followed by the exposure of the photoresist film 3 to a light with an energy of ½ Eth. As a result, there are formed secondarily exposed regions 4' that each overlap with the primarily exposed regions 4 at a width of ½ W1. The shift can be accomplished by either the mask or the substrate.

Figure 4:
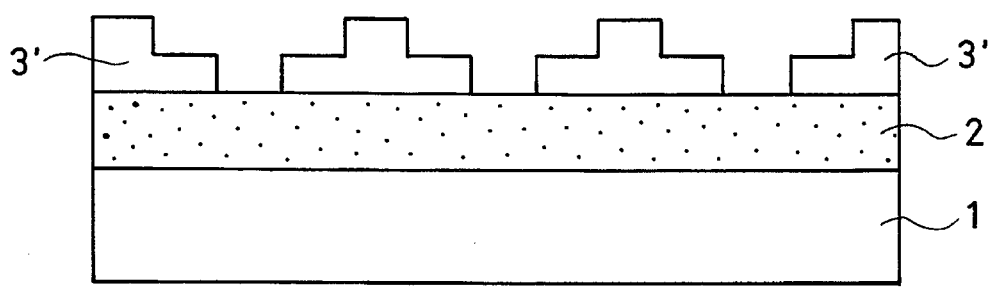

FIG. 4 is a cross sectional view after the photoresist film 3 having the primarily and secondarily exposed regions 4 and 4' is subjected to wet development, to photoresist film patterns 3', each being divided into a lower half and an upper half. The regions 7 in which the primarily exposed regions 4 overlap with the secondarily exposed regions 4' become exposed to a light with an energy of $E_{th}$ and thus, are completely removed. On the other hand, the non-overlapped regions of the primarily and secondarily exposed regions 4 and 4' are removed at half of the thickness of the photoresist film 3.

Figure 5:
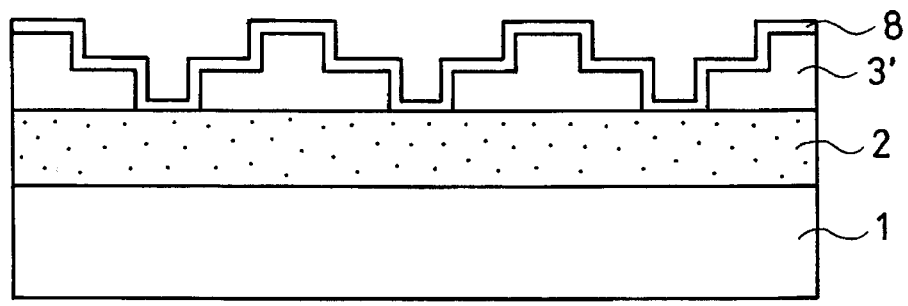

FIG. 5 is a cross sectional view after an insulating layer 8, such as silicon oxide or SOG, is deposited entirely over the resulting structure.

Figure 6:
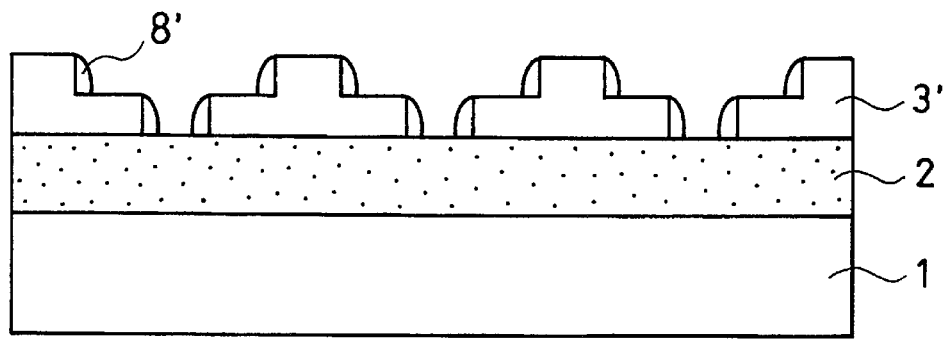

FIG. 6 is a cross sectional view after the insulating layer 8 is subjected to anisotropic etch, to form insulating layer spacers 8' at the side walls of the upper halves and the lower halves of the photoresist film patterns 3'. In the case of employing silicon oxide as the insulating layer, the etch selection ratio of silicon oxide to photoresist film is at least 20:1.

Figure 7:
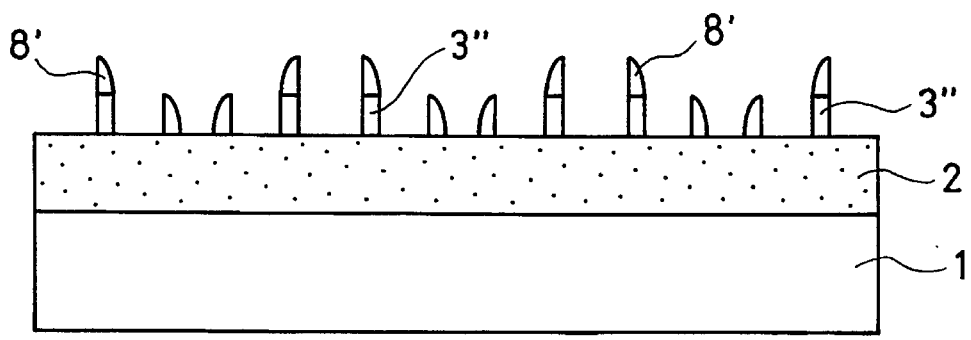

FIG. 7 is a cross sectional view after the photoresist film patterns 3' are dry etched with the insulating layer spacers 8' serving as a mask, to form photoresist film patterns 3" beneath the spacers 8'.

Figure 8:
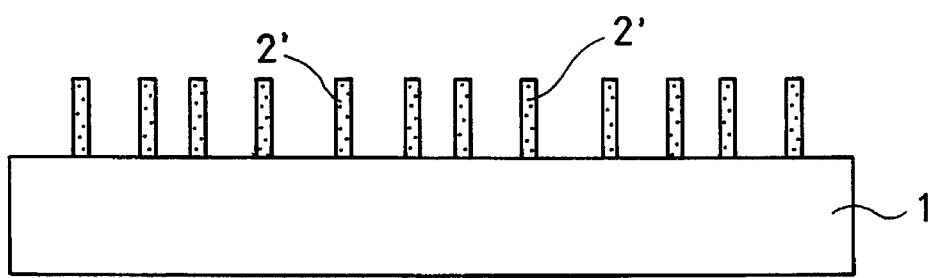

FIG. 8 is a cross sectional view after the lower layer 2 is subjected to dry etch with the insulating layer spacers 8' serving as a mask, to form lower layer patterns 2, followed by the removal of the insulating spacers 8' and the submicroscopic photoresist film patterns 3". This figure shows that the lower layer patterns 2' are narrow with a minimal distance therebetween.

As described hereinbefore, the present invention starts with acknowledgment of the threshold energy with respect to the thickness of a coated photoresist film. After being primarily exposed through a mask to a light with an energy of ½ $E_{th}$, the photoresist film is again exposed to a light with the same energy with the mask shifted at a predetermined distance leftward or rightward. The once-exposed regions of the photoresist film become different from the twice-exposed regions in the thickness, which results in photoresist film patterns having lower halves and upper halves. Insulating spacers are formed at the side walls of the lower halves and upper halves and used as a mask upon dry etching, so as to form submicroscopic patterns. Consequently, lower layer patterns which have a narrower distance therebetween than can be formed by photolithography can be formed in accordance with the present invention.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming submicroscopic patterns of a semiconductor device, comprising the steps of:

coating a photoresist film on a lower layer to be patterned;

primarily exposing the photoresist film through a mask having chrome patterns to a light with an energy lower than the threshold energy for the thickness of the photoresist film;

secondarily exposing the photoresist film through the mask to a light with an energy lower than the threshold energy, said mask having been shifted at a predetermined distance;

subjecting the exposed photoresist film to development, to completely remove the regions in which the primarily exposed regions overlap with the secondarily exposed regions and half remove the once-exposed regions to form photoresist film patterns, each having four side walls;

depositing an insulating layer entirely over the resulting structure;

subjecting the insulating layer to anisotropic etch, to form insulating layer spacers at the side walls of the photoresist film patterns; and dry etching the photoresist film patterns and the lower layer with the insulating layer spacers serving as a mask, to form lower layer patterns having a submicroscopic width and a submicroscopic distance therebetween.

2. A method in accordance with claim 1, wherein the energy of the light, both primary and secondary, is half of the threshold energy for the thickness of the photoresist film.

3. A method in accordance with claim 1, wherein the areas of the photoresist film in which the primarily exposed regions overlap with the secondarily exposed regions are completely removed while the areas of the photoresist film which are exposed once are half removed.

4. A method in accordance with claim 1, wherein the photoresist film is a positive photoresist film.

5. A method in accordance with claim 1, wherein the photoresist film on a substrate is shifted relative to the mask.

6. A method in accordance with claim 1, wherein an etch selection ratio of a material for the insulating layer spacer to the photoresist film is at least 20:1.

7. A method in accordance with claim 1, wherein the mask is shifted at the same distance as half of the width of the chrome patterns.

\* \* \* \* \*